United States Patent
Zhang et al.

(10) Patent No.: US 10,261,410 B2
(45) Date of Patent: Apr. 16, 2019

(54) OPC METHOD FOR A PATTERN CORNER

(71) Applicant: Shanghai Huali Microelectronics Corporation, Shanghai (CN)

(72) Inventors: Yueyu Zhang, Shanghai (CN); Yue Wang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/800,088

(22) Filed: Nov. 1, 2017

(65) Prior Publication Data

US 2019/0033702 A1 Jan. 31, 2019

(30) Foreign Application Priority Data

Jul. 31, 2017 (CN) .......................... 2017 1 0636987

(51) Int. Cl.
| | |
|---|---|
| G03F 1/36 | (2012.01) |
| H01L 21/66 | (2006.01) |
| H01L 21/67 | (2006.01) |
| G03F 1/84 | (2012.01) |
| G06F 17/50 | (2006.01) |
| G03F 1/44 | (2012.01) |
| B82Y 40/00 | (2011.01) |

(52) U.S. Cl.
CPC .................. *G03F 1/36* (2013.01); *G03F 1/44* (2013.01); *G03F 1/84* (2013.01); *G06F 17/5081* (2013.01); *H01L 21/67253* (2013.01); *H01L 22/26* (2013.01); *B82Y 40/00* (2013.01)

(58) Field of Classification Search
CPC ..... G03F 1/36; G03F 1/44; G03F 1/84; G06F 17/5081; H01L 21/67253; H01L 22/26; B82Y 40/00
See application file for complete search history.

(56) References Cited

U.S. PATENT DOCUMENTS

| | | | | |
|---|---|---|---|---|
| 6,044,007 | A * | 3/2000 | Capodieci | G03F 7/70425 365/120 |
| 6,110,647 | A * | 8/2000 | Inoue | G03F 7/0035 430/296 |
| 6,127,071 | A * | 10/2000 | Lu | G03F 7/70441 430/30 |
| 6,280,887 | B1 * | 8/2001 | Lu | G03F 7/70441 430/5 |
| 6,492,078 | B1 * | 12/2002 | Ohnuma | G03F 1/36 430/30 |

(Continued)

*Primary Examiner* — Nha T Nguyen
(74) *Attorney, Agent, or Firm* — Tianchen LLC

(57) ABSTRACT

The present invention discloses an OPC method for a pattern corner, comprising the following steps of: S01: providing a photomask which has an original layout containing target patterns, wherein the target patterns have at least one convex corner at a vertex of two first adjacent sides with an angle of 90-degree therebetween and at least one concave corner at a vertex of two second adjacent sides with an angle of 270-degree; S02: modifying the original layout to obtain a modified layout by adding at least one first rectangular correction pattern from outside of the convex corner and/or removing at least one second rectangular correction pattern from inside of the concave corner; S03: performing a model-based OPC correction to the modified layout to obtain a corrected photomask.

12 Claims, 3 Drawing Sheets

(56) References Cited

U.S. PATENT DOCUMENTS

| | | | | |
|---|---|---|---|---|
| 6,670,081 B2* | 12/2003 | Laidig | ................ | G03F 1/36 |
| | | | | 430/5 |
| 6,829,380 B1* | 12/2004 | Choo | ................ | G03F 7/70441 |
| | | | | 250/492.22 |
| 7,673,270 B1* | 3/2010 | Wang | ................ | G03F 1/36 |
| | | | | 716/112 |
| 7,853,919 B2* | 12/2010 | Huang | ................ | G03F 7/70675 |
| | | | | 430/5 |
| 8,527,916 B1* | 9/2013 | Chiang | ................ | G03F 1/36 |
| | | | | 716/50 |
| 2002/0028393 A1* | 3/2002 | Laidig | ................ | G03F 1/36 |
| | | | | 430/5 |
| 2005/0036175 A1* | 2/2005 | Klatchko | ................ | G03F 1/78 |
| | | | | 358/3.21 |
| 2005/0280800 A1* | 12/2005 | Laiding | ................ | G03F 1/36 |
| | | | | 355/77 |
| 2006/0222963 A1* | 10/2006 | Terhune | ................ | G03F 1/36 |
| | | | | 430/5 |
| 2007/0220477 A1* | 9/2007 | Sagisaka | ................ | G03F 1/36 |
| | | | | 716/53 |
| 2009/0176069 A1* | 7/2009 | Yang | ................ | G03F 1/36 |
| | | | | 428/195.1 |
| 2010/0055578 A1* | 3/2010 | Fujimura | ................ | B82Y 10/00 |
| | | | | 430/5 |
| 2010/0058282 A1* | 3/2010 | Fujimura | ................ | B82Y 10/00 |
| | | | | 716/55 |
| 2013/0326434 A1* | 12/2013 | Feng | ................ | G03F 1/36 |
| | | | | 716/52 |
| 2017/0046471 A1* | 2/2017 | Xu | ................ | G06T 7/0006 |
| 2018/0074393 A1* | 3/2018 | Pang | ................ | G03F 1/36 |

\* cited by examiner

===Prior Art=== under-compensation     over-compensation     good-compensation

===Prior Art===

===Prior Art===

OPC METHOD FOR A PATTERN CORNER

CROSS-REFERENCE TO RELAYED APPLICATION

This application claims the priority benefit of China application serial no. 201710636987.X, filed Jul. 31, 2017. All disclosure of the China application is incorporated herein by reference.

FIELD OF THE INVENTION

The present invention relates to the field of semiconductor fabrication technology, more particularly to an OPC correction method for a pattern corner.

BACKGROUND OF THE INVENTION

With the continuing decrease of technology node, demands for pattern size precision and overlay accuracy are increasing. However, during the lithographic process, due to the resolution limitation of optical imaging, the right-angled pattern corner in the photomask layout will be inevitably subjected to rounding distortion when being exposed finally and imagined on a silicon wafer. If not being corrected properly, such corner distortion will cause many problems like size reduction of the pattern corner, which will bring adverse effects on the overlay accuracy and the pattern coverage rate. More seriously, such rounding distortion may reduce the actual process window in the process for forming patterns which conform the design rules and considered safe. For example, the corner rounding of the patterns in the metal layer as shown in FIG. 1 reduces the coverage area with the contact layer, resulting in the shortage of pattern coverage. To avoid the pattern corner distortion, an Optical Proximity Correction (OPC) is generally adopted to perform correction in the industry. The OPC method for corner rounding in the prior art mainly includes a rule-based OPC using serif correction and a model-based OPC.

In early stage, in the rule-based OPC, corner rounding is usually improved by adding serif patterns. The size of the added serif is generally selected from empirical values, or determined by designing a test pattern and actual measuring wafer data. However, as the pattern size is becoming smaller and smaller, such photomask pattern correction method is not applicable since the Optical Proximity effect becomes more obvious on patterns of small size. Therefore, the size of the serif required to be added at different positions and under various conditions cannot be determined depending on simple experience or limited measurement results, which may easily cause overcompensation or under-compensation as shown in FIG. 2.

Although the model-based OPC seems to be a possible solution since it can be applied under different conditions, the compensation effect at the pattern corner will be affected and limited by the correction segment when the model-based OPC is used. In theory, the correction effect becomes better as the segment is finer, but in practical application, the boundary segment is not generally made fine to ensure a reasonable calculation time and a better global correction result.

In addition, since there is a competitive relation between the corner and the straight line, when the corner distortion is greatly reduced, it may cause the undulate of the straight line and a worse correction result. Therefore, it is still difficult to improve the corner correction by model-based OPC.

At present, there lacks a correction manner which combines the above two methods. The correction result is not satisfied by simply combining the model-based OPC and the serif correction, since the jogs introduced by the serif correction will affect the segment of the target pattern, or even cause a deviation of the corrected pattern from the target pattern. As shown in FIG. 3, a larger serif will directly cause a corner convex to deviate from the target right-angled corner, while a smaller serif may even worsen the rounding of the corner in addition to affects the segment. Therefore, there exists a need to provide a correction manner which can effectively combine the model-based OPC and the serif correction.

SUMMARY OF THE INVENTION

The technical problem to be solved by the present invention is to provide a OPC method for a pattern corner by adding rectangular correction patterns to or removing rectangular correction patterns from the pattern corner, to obtain a better corner correction result than the conventional method and effectively reduce the distortion of the corner pattern, thereby solving the process problems like overlay error and coverage shortage due to the serious rounding of the pattern corner.

To achieve the above objects, the present invention adopts the following technical solution:

An OPC method for a pattern corner, wherein comprising the following steps of:

S01: providing a photomask which has an original layout containing target patterns, wherein the target patterns have at least one convex corner at a vertex of two first adjacent sides with an angle of 90-degree therebetween and at least one concave corner at a vertex of two second adjacent sides with an angle of 270-degree; each of the first adjacent side and the second adjacent side has a length longer than a minimum line width of the original layout;

S02: modifying the original layout to obtain a modified layout by adding at least one rectangular correction pattern from outside of the convex corner and/or removing at least one rectangular correction pattern from inside of the concave corner; wherein the added rectangular correction pattern has a diagonal line located on an angle bisector of the convex corner, and one vertex located at the same position with the convex corner or located within a target pattern containing the convex corner, the added rectangular correction pattern is not coincident with the other target patterns; the removed rectangular correction pattern has a diagonal line located on an angle bisector of the concave corner and a vertex located at the same position with the concave corner or located outside a target pattern containing the concave corner; the other vertex of the removed rectangular correction pattern are all within the target pattern containing the concave corner;

S03: performing a model-based OPC correction on the corrected object layer, to obtain a mask layer.

Furthermore, when a space between the convex corner and a target pattern not containing the convex corner is larger than or equal to a space threshold value, a first rectangular correction pattern is added outside the convex corner; when the space between the convex corner and the target pattern not containing the convex corner is smaller than the space threshold value, at least two second rectangular correction patterns are added outside the convex corner; the added second rectangular correction patterns remain greater than or equal to one-third of the minimum line width with other target patterns except the target pattern where the convex corner is located; wherein the space threshold value is determined according to the minimum line width of the original layout.

Furthermore, the first rectangular correction pattern with a first size has a side length of 30 nm-120 nm.

Furthermore, the second rectangular correction pattern with a second size has a side length of 10 nm-80 nm.

Furthermore, the space threshold value is 1-4 times of the minimum line width of the original layout.

Furthermore, when a line width of the concave corner is larger than or equal to a line width threshold, a first rectangular correction pattern with a first size is removed from inside the concave corner; when the line width of the concave corner is smaller than the line width threshold, at least two second rectangular correction patterns with a second size is removed from inside the concave corner; the removed second rectangular correction pattern remain greater than or equal to one-third of the minimum line width with the rectangle boundary of the target pattern where the convex corner is located in; wherein the line width threshold is determined according to the minimum line width of the original layout.

Furthermore, the line width threshold is 1 to 4 times of the minimum line width of the original layout.

Furthermore, the first rectangular correction pattern with the first size has a side length of 30 nm-120 nm.

Furthermore, the second rectangular correction pattern with the second size has a side length of 10 nm-80 nm.

Furthermore, the value of the length threshold ranges from 20-300 nm.

Furthermore, the length threshold is greater than or equal to the minimum line width in the original layout.

Furthermore, when a vertex of the added rectangular correction pattern is located inside the target pattern, the side length of an overlapped portion between the rectangular correction pattern and the target pattern is 0-50 nm; when a vertex of the removed rectangular correction pattern is located outside the target pattern, the side length of an overlapped portion between the rectangular correction pattern and the target pattern is 0-50 nm.

According to the present invention, more boundaries can be obtained for photomask layout correction by adding or removing rectangular correction pattern to or from different pattern corners. Furthermore, the rectangular correction patterns with different sizes, types and numbers can be added or removed according to the positions of the pattern corners, which avoids imagining of the added or removed rectangular correction pattern. As a result, compared to the conventional method, the pattern corner correction method of the present invention can obtain a better correction effect, efficiently reduce the distortion of the pattern corner, overcome the defects of overlay error and coverage shortage due to the serious corner rounding, and increase the process window.

DETAILED DESCRIPTION OF THE EMBODIMENTS

To make the object, the technical solution and the advantage of the present invention clearer, the specific embodiments of the present invention are described in detail below in combination with drawings.

Figure 1:
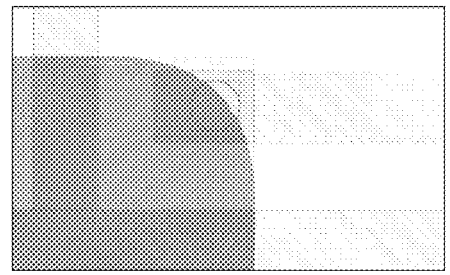
FIG. 1 is a schematic diagram showing the coverage shortage defect due to the corner rounding.
Figure 2:
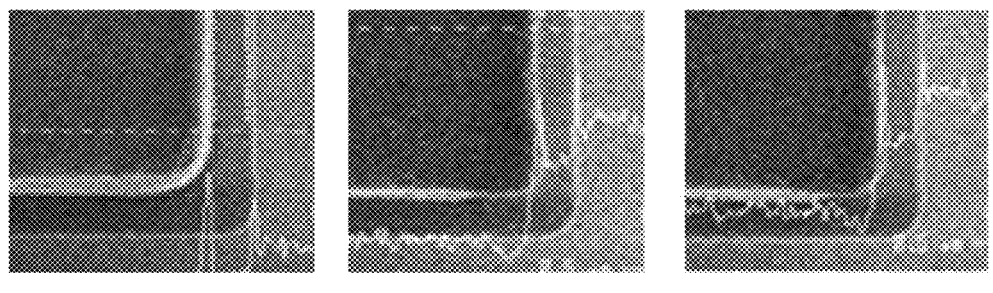
FIG. 2 is a schematic diagram showing the rule-based OPC corner correction.
Figure 3:
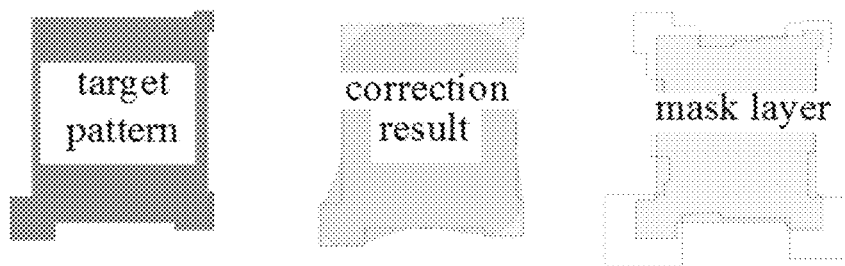
FIG. 3 is a schematic diagram showing an OPC method combined of serif correction and model-based OPC correction.
Figure 4:
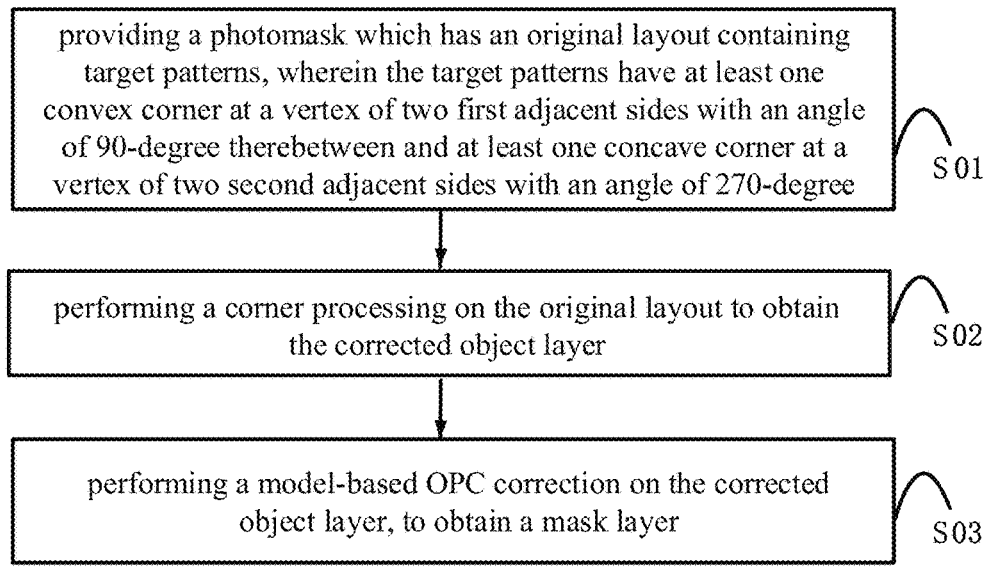
FIG. 4 is a flow chart of an OPC method for a pattern corner according to the present invention.

As shown in FIG. 4, which is a flow chart of an OPC method for a pattern corner according to the present invention, the OPC method for the pattern corner comprises the following steps:

S01: providing a photomask which has an original layout containing target patterns. The target patterns have at least one convex corner at a vertex of two first adjacent sides with an angle of 90-degree therebetween and at least one concave corner at a vertex of two second adjacent sides with an angle of 270-degree; each of the first adjacent side and the second adjacent side has a length longer than a minimum line width of the original layout.

Wherein, the angle between two adjacent sides is defined as an angle of the target pattern. The length of each of the adjacent sides is greater than a length threshold, and the length threshold is greater than or equal to the minimum line width of the original layout. Generally, the length threshold can be 20-300 nm.

S02: modifying the original layout to obtain a modified layout by adding at least one rectangular correction pattern from outside of the convex corner and/or removing at least one rectangular correction pattern from inside of the concave corner; wherein the added rectangular correction pattern has a diagonal line located on an angle bisector of the convex corner, and one vertex located at the same position with the convex corner or located within a target pattern containing the convex corner, the added rectangular correction pattern is not coincident with the other target patterns; the removed rectangular correction pattern has a diagonal line located on an angle bisector of the concave corner and a vertex located at the same position with the concave corner or located outside a target pattern containing the concave corner; the other vertex of the removed rectangular correction pattern are all within the target pattern containing the concave corner.

The convex corner is required to be classified according to interval before the rectangle correction pattern is added into the convex corner. Firstly, an interval threshold is defined as a standard during the classification, and the interval threshold is 1-4 times of the minimum line width of the original layout.

When the interval between the convex corner and other target pattern except the target pattern where the convex corner is located is larger than or equal to the interval threshold, one first rectangular correction pattern is added outside the convex corner. Wherein the side length of the first rectangular correction pattern is 30 nm-120 nm, that is, the length and width of the first rectangular correction pattern are taken values within a range of 30 nm-120 nm.

When the interval between the convex corner and other target pattern except the target pattern where the convex corner is located is smaller than the interval threshold, at least two second rectangular correction patterns are added outside the convex corner. Wherein the side length of the second rectangular correction pattern is 10 nm-80 nm, that is, the length and width of the second rectangular correction pattern is taken values within a range of 10 nm-80 nm.

Moreover, the relative size of the two second rectangular correction patterns may be decided according to the final requirements, that is, the two second rectangular correction patterns may be the same or may be different, and there may be only one vertex superposed between the two second rectangular correction patterns, or there may be an overlapped region between the two second rectangular correction patterns.

In other words, when the interval between the convex corner and the other target pattern except the target pattern where the convex corner is located is smaller than the interval threshold, two or more second rectangular correction patterns may be added outside the convex corner according to the actual requirement. According to the actual experience, the desired effects of the correction becomes better since the number of the sides becomes more during the corresponding corrections if the number of the added second rectangular correction patterns becomes more.

Similarly, it is required to classify the concave corner according to line width before the rectangle correction pattern is removed from the concave corner. Firstly, a line width threshold is defined as a standard during the classification, and the width threshold is 1-4 times of the minimum line width of the original layout.

When the line width of the target pattern where the concave corner is located is larger than or equal to the line width threshold, one first rectangular correction pattern is removed inside the concave corner; wherein the side length of the first rectangular correction pattern is 30 nm-120 nm, that is, the length and width of the first rectangular correction pattern are taken values within a range of 30 nm-120 nm.

When the line width of the target pattern where the concave corner is located is smaller than the line width threshold, at least two second rectangular correction patterns is removed inside the concave corner, wherein the side length of the second rectangular correction patterns is 10 nm-80 nm, that is, the length and width of the second rectangular correction patterns are taken values within a range of 10 nm-80 nm.

In other words, when the line width of the target pattern where the concave corner is located is smaller than the line width threshold, one or more second rectangular correction patterns may be removed from inside of the convex corner according to the actual requirement. According to the actual experience, the desired effects of the correction becomes better since the number of the sides becomes more during the corresponding corrections if the number of the removed second rectangular correction patterns becomes more.

In addition, the pattern size of the first rectangular correction pattern and the second rectangular correction patterns is required to satisfy the condition of less than lithography resolution of the current layer, to avoid image blur problem.

The diagonal lines of the rectangular correction pattern are located on the angle bisector of the convex corner or concave corner; in addition, the boundaries of the convex corner or the concave corner may be superposed or not be superposed with the rectangular correction pattern, the rectangular correction pattern can only be immediately adjacent to the corresponding corner. Specifically, when the convex corner or the concave corner is superposed with one vertex of the rectangle correction pattern, the boundaries of the convex corner or the concave corner are not superposed with the rectangular correction pattern. When the convex corner or the concave corner is not superposed with vertexes of the rectangle correction pattern, the boundaries of the convex corner or the concave corner are superposed with the rectangular correction pattern; one vertex of the rectangle correction pattern added is in the target pattern, and a portion overlapped with the target pattern is a rectangle, and the length and width of the rectangle are within a range of a nm-50 nm. One vertex of the removed rectangular correction pattern is located outside of the target pattern, and a portion overlapped with a region outside the target pattern is a rectangle, and the length and width of the rectangle are within a range of 0 nm-50 nm.

The pattern corner processing method adopted in the present step is applicable to not only a pattern corner in an isolated pattern but also a corner in a dense pattern, and a correction can be performed according to the corresponding pattern corner processing method, only if the pattern corner condition is in conformity with the corresponding limitation of the present invention.

Figure 5:
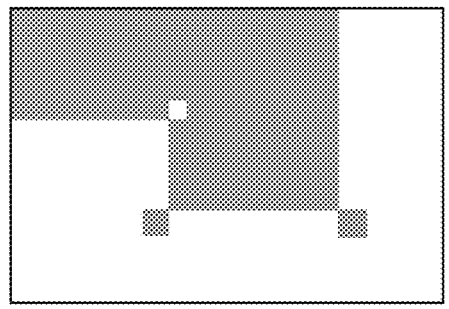
FIG. 5 is a diagram showing corner correction to an iso pattern according to the present invention.

As shown in FIG. 5 which is a diagram showing corner correction to an iso pattern according to the present invention, an interval between the convex corner in the isolated pattern and other target pattern except the target pattern where the convex corner is located is general large, which is in conformity with a case where the interval is larger than or equal to the interval threshold, so one first rectangular correction pattern is added outside the convex corner.

Figure 6:
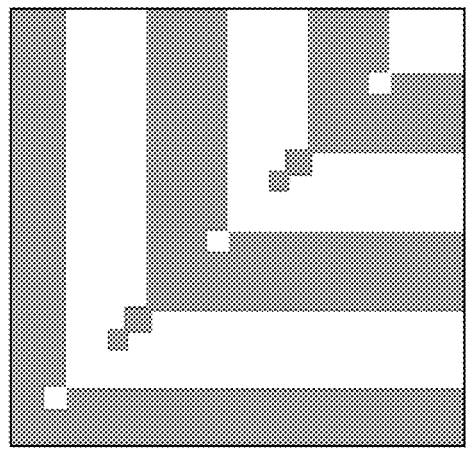
FIG. 6 is a diagram showing corner correction to dense patterns according to the present invention.

As shown in FIG. 6 which is a diagram showing corner correction to dense patterns according to the present invention, an interval between the convex corner in the dense pattern and other target pattern except the target pattern where the convex corner is located is general small, which is in conformity with a case where the interval is smaller than the interval threshold, and thus two second rectangular correction patterns are added outside the convex corner, because the second rectangular correction patterns has a size smaller than the first rectangular correction pattern due to the small interval of the convex corner.

S03: performing a model-based OPC correction on the corrected target layer, to obtain a mask layer. The OPC correction result is exposed and imagined on a silicon wafer by the mask layer after being underwent the lithography.

Figure 7:
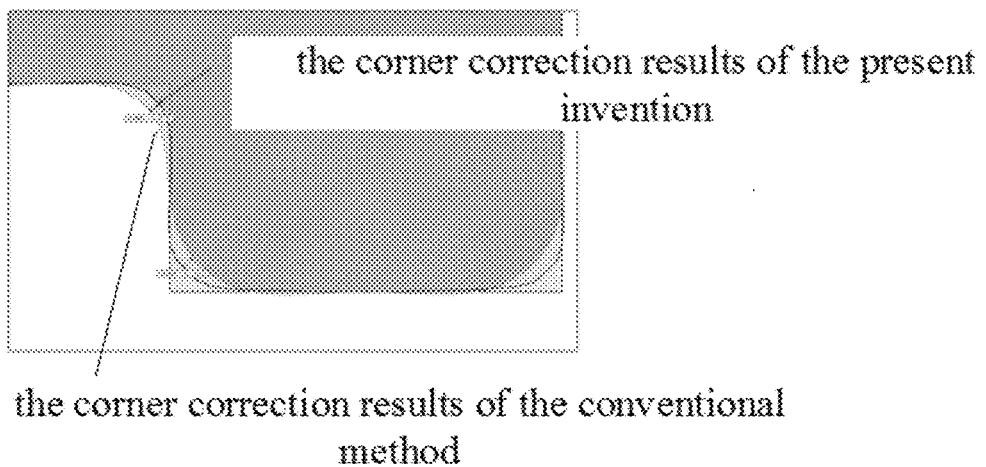
FIG. 7 is a contrast diagram showing corner correction results for an iso pattern between the present invention and the conventional method.
Figure 8:
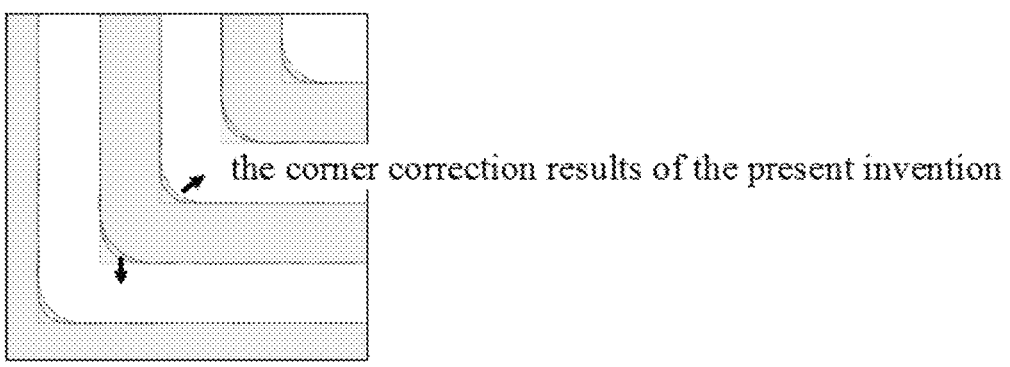
FIG. 8 is a contrast diagram showing corner correction results for dense patterns between the present invention and the conventional method.

The OPC method for the pattern corner provided in the present invention can perform classification according to the line width and interval of the corner, and the different corner processing method can be adopted for the different corners. Therefore, the correction method for the present invention has better correction function for both the corner of the dense pattern and the corner of the isolated pattern, wherein FIG. 7 is a contrast diagram showing corner correction results for an iso pattern between the present invention and the conventional method, and FIG. 8 is a contrast diagram showing corner correction results for dense patterns between the present invention and the conventional method.

Obvious, in comparison with the conventional method, the method of the present invention can attain the better correction effects for the corner. The distortion of the corner pattern is efficiently reduced, the hot spot problem in process such as the lamination error and the shortage of the coverage area due to the serious rounding of the corner are solved, and the process window is increased.

The above is only the preferred embodiment of the present invention. Said embodiment is not intended to limit the patent protection scope of the present invention. Therefore, all the equivalent structural changes made using the contents of the specification and drawings of the present invention should be encompassed in the protection scope of the present invention in a similar way.

The invention claimed is:

1. An OPC method for a pattern corner, wherein comprising the following steps of:
   S01: providing a photomask which has an original layout containing target patterns, wherein the target patterns have at least one convex corner at a vertex of two first adjacent sides with an angle of 90-degree therebetween and at least one concave corner at a vertex of two second adjacent sides with an angle of 270-degree; each of the first adjacent side and the second adjacent side has a length longer than a minimum line width of the original layout;
   S02: modifying the original layout to obtain a modified layout by adding at least one rectangular correction pattern from outside of the convex corner and removing at least one rectangular correction pattern from inside of the concave corner; wherein the added rectangular correction pattern has a diagonal line located on an angle bisector of the convex corner, and one vertex located at the same position with the convex corner or located within a target pattern containing the convex corner, the added rectangular correction pattern is not coincident with the other target patterns; the removed rectangular correction pattern has a diagonal line located on an angle bisector of the concave corner and a vertex located at the same position with the concave corner or located outside a target pattern containing the concave corner; the other vertex of the removed rectangular correction pattern are all within the target pattern containing the concave corner;
   S03: performing a model-based OPC correction on a target layer, to obtain a mask layer;
   S04: exposing and imagining OPC correction results on a silicon wafer by the mask layer through a lithography process;
   wherein when a line width of the concave corner is larger than or equal to a line width threshold, a first rectangular correction pattern with a first size is removed from inside the concave corner; when the line width of the concave corner is smaller than the line width threshold, at least two second rectangular correction patterns with a second size is removed from inside the concave corner; wherein the line width threshold is determined according to the minimum line width of the original layout.

2. The OPC method for the pattern corner according to claim 1, wherein when a space between the convex corner and a target pattern not containing the convex corner is larger than or equal to a space threshold value, a first rectangular correction pattern is added outside the convex corner; when the space between the convex corner and the target pattern not containing the convex corner is smaller than the space threshold value, at least two second rectangular correction patterns are added outside the convex corner; the added second rectangular correction patterns remain greater than or equal to one-third of the minimum line width with other target patterns except the target pattern where the convex corner is located; wherein the space threshold value is determined according to the minimum line width of the original layout.

3. The OPC method for the pattern corner according to claim 2, wherein the first rectangular correction pattern with a first size has a side length of 30 nm-120 nm.

4. The OPC method for the pattern corner according to claim 2, wherein the second rectangular correction pattern with a second size has a side length of 10 nm-80 nm.

5. The OPC method for the pattern corner according to claim 2, wherein the space threshold value is 1-4 times of the minimum line width of the original layout.

6. The OPC method for the pattern corner according to claim 1, the removed second rectangular correction pattern remain greater than or equal to one-third of the minimum line width with the rectangle boundary of the target pattern where the convex corner is located in.

7. The OPC method for the pattern corner according to claim 6, wherein the line width threshold is 1 to 4 times of the minimum line width of the original layout.

8. The OPC method for the pattern corner according to claim 6, wherein the first rectangular correction pattern with the first size has a side length of 30 nm-120 nm.

9. The OPC method for the pattern corner according to claim 6, wherein the second rectangular correction pattern with the second size has a side length of 10 nm-80 nm.

10. The OPC method for the pattern corner according to claim 1, wherein the value of the length threshold ranges from 20-300 nm.

11. The OPC method for the pattern corner according to claim 10, wherein the length threshold is greater than or equal to the minimum line width in the original layout.

12. The OPC method for the pattern corner according to claim 1, wherein when a vertex of the added rectangular correction pattern is located inside the target pattern, the side length of an overlapped portion between the rectangular correction pattern and the target pattern is 0-50 nm; when a vertex of the removed rectangular correction pattern is located outside the target pattern, the side length of an overlapped portion between the rectangular correction pattern and the target pattern is 0-50 nm.

* * * * *